United States Patent
Yamazaki

(10) Patent No.: US 9,705,459 B2
(45) Date of Patent: Jul. 11, 2017

(54) METHOD OF OPERATING AN ELECTRONIC DEVICE WITH A MASTER FADER AND A PLURALITY OF SLAVE FADERS

(71) Applicant: TEAC Corporation, Tokyo (JP)

(72) Inventor: Toru Yamazaki, Tokyo (JP)

(73) Assignee: TEAC Corporation, Tokyo (JP)

( * ) Notice: Subject to any disclaimer, the term of this patent is extended or adjusted under 35 U.S.C. 154(b) by 0 days.

(21) Appl. No.: 14/940,008

(22) Filed: Nov. 12, 2015

(65) Prior Publication Data

US 2016/0072464 A1    Mar. 10, 2016

Related U.S. Application Data

(62) Division of application No. 13/615,112, filed on Sep. 13, 2012, now Pat. No. 9,215,021.

(30) Foreign Application Priority Data

Jan. 12, 2012 (JP) ................. 2012-003968

(51) Int. Cl.
*H03H 3/02* (2006.01)
*H03G 5/02* (2006.01)
*H04H 60/04* (2008.01)
*H03G 3/30* (2006.01)
*H03G 3/02* (2006.01)
*G06F 3/0481* (2013.01)

(52) U.S. Cl.
CPC ............ *H03G 3/02* (2013.01); *H03G 3/301* (2013.01); *H03G 5/02* (2013.01); *H04H 60/04* (2013.01); *G06F 3/0481* (2013.01)

(58) Field of Classification Search
None
See application file for complete search history.

(56) References Cited

FOREIGN PATENT DOCUMENTS

JP    4123176 B2    7/2008

OTHER PUBLICATIONS

Yamaha, PM5D Digital Mixing Console PM5D/PM5D-RH Owner's Manual, 2004, pp. 37-40 and 73-76.

*Primary Examiner* — Daniell L Negron
(74) *Attorney, Agent, or Firm* — Seed Intellectual Property Law Group LLP

(57) ABSTRACT

An electronic device with faders. In order to enable a user to readily ascertain which of a plurality of faders belongs to the same group and which one of the faders in the group is a master fader, indicators of all of the faders in the group are lighted when the thus-set master fader in the grouped faders is operated. When the user operates slave faders, the operation is revoked, and only the indicator corresponding to the master fader is lighted or blinked.

9 Claims, 6 Drawing Sheets

METHOD OF OPERATING AN ELECTRONIC DEVICE WITH A MASTER FADER AND A PLURALITY OF SLAVE FADERS

PRIORITY INFORMATION

The present application is a division of U.S. patent application Ser. No. 13/615,112 filed Sep. 13, 2012, which claims priority to Japanese Patent Application No. 2012-003968, filed on Jan. 12, 2012, which are each incorporated herein by reference in their entirety.

BACKGROUND

Technical Field

The present invention relates to an electronic device, such as a multitrack recorder and a mixer, and more particularly to a technique for grouping faders.

Description of the Related Art

Audio signals of a plurality of channels are input to a multitrack recorder. The thus-input audio signals are recorded in the recorder after having undergone processing, like mixing, while sound volume levels of the respective channels are controlled with faders. In order to increase or decrease a total sound volume of the channels after the sound volume levels of the respective channels have been controlled and balanced, all of the faders of the channels must be operated at the same ratio, so that the operation is difficult.

Therefore, according to a hitherto proposed technique, there is provided a mode for grouping a plurality of faders. When any of the faders in the group is operated, the other faders in the same group are shifted so as to follow the operated fader in accordance with an amount of change. Specifically, when any of the faders in the group is operated, the other faders belonging to the same group are automatically moved in synchronism with the movement by means of a motor, or the like (moving faders).

Grouping of the faders is effective from the viewpoint of ease of operation. Concurrently, it is also necessary to enable a user to easily, visually recognize which faders are grouped. In the case of the moving faders, the grouped faders move in a following manner. Therefore, it is possible to check which faders are grouped from the movements. However, if an anomaly occurs in a moving mechanism, checking will become impossible to perform. Alternatively, in the case of grouping of faders that does not entail movement of the faders, it is impossible to check which faders are grouped from movements.

JP 4123176 B discloses display control means. Specifically, when an operating element assigned to a channel belonging to a certain group is operated, the display control means blinks, in a pattern representing the group, display means corresponding to operating elements assigned to channels belonging to the same group as that to which the channel belongs.

When any of the faders belonging to the certain group is operated, blinking display means of the faders belonging to the group is effective at visually checking which faders are grouped. In the meantime, when any of the faders in the group is operated, the other faders in the same group are also moved unconditionally so as to follow the movement. As a consequence, even when operation of any of the faders in the group is false, there arises a problem of all of the other faders in the same group following the false operation.

In such a case, there is also a conceivable measure to take any of a plurality of grouped faders as a master fader and take the other faders in the group as slave faders. On the occasion of adoption of such a configuration, it is desirable for the user to be able to easily ascertain which fader is a master and which faders are slaves.

BRIEF SUMMARY

The invention is to provide a multitrack recorder that enables the user to easily ascertain which of a plurality of faders belong to the same group, which one of the faders is a master in the group, and which faders are slave faders in the same group.

The present invention is directed toward an electronic device with faders characterized by comprising: a plurality of faders that are disposed in correspondence with a plurality of channels and that control levels of audio signals; display means provided for each of the plurality of faders; group setting means for setting a plurality of arbitrary faders among the plurality of faders as a group; and display control means that takes as a master fader any one of the plurality of faders set as a group, that takes remaining faders in the same group as slave faders, that lights the display means corresponding to all of the faders in the same group when a user has operated the master fader, and that lights or blinks only the display means corresponding to the master fader in the same group when the user has operated any of the slave faders.

In one embodiment of the invention, the electronic device further comprises control means that synchronously controls levels of audio signals of all of the channels in the same group when the user has operated the master fader and that, when the user has operated any of the slave faders, revokes the operation and does not control the levels of the audio signals of all of the channels in the same group.

Moreover, in another embodiment of the invention, the display control means automatically sets a fader situated at a predetermined position, among the plurality of faders set as the group, as a master fader and also automatically sets faders remaining in the same group as slave faders.

According to the invention, the user can readily ascertain which faders of the plurality of faders belong to the same group, by visually recognizing a lighted status of the display means. Moreover, the user can readily ascertain which one of the faders in the group is a master fader and which faders of the group are slave faders. Accordingly, the user can readily increase or decrease a whole level of audio signals of a plurality of channels while maintaining a balance of the audio signals, by operating the master fader.

The invention will be more clearly comprehended by reference to the embodiments provided below. However, the embodiments provided below are illustrative, and the scope of the invention is not limited to the embodiments.

BRIEF DESCRIPTION OF THE SEVERAL VIEWS OF THE DRAWINGS

Preferred embodiments of the present invention will be described in detail by reference to the following drawings, wherein.

DETAILED DESCRIPTION

By reference to the drawings, embodiments of the present invention are hereunder described by taking a multitrack recorder as an example electronic device with faders. The invention, however, can be applied to equipment other than the multitrack recorder.

Figure 1:
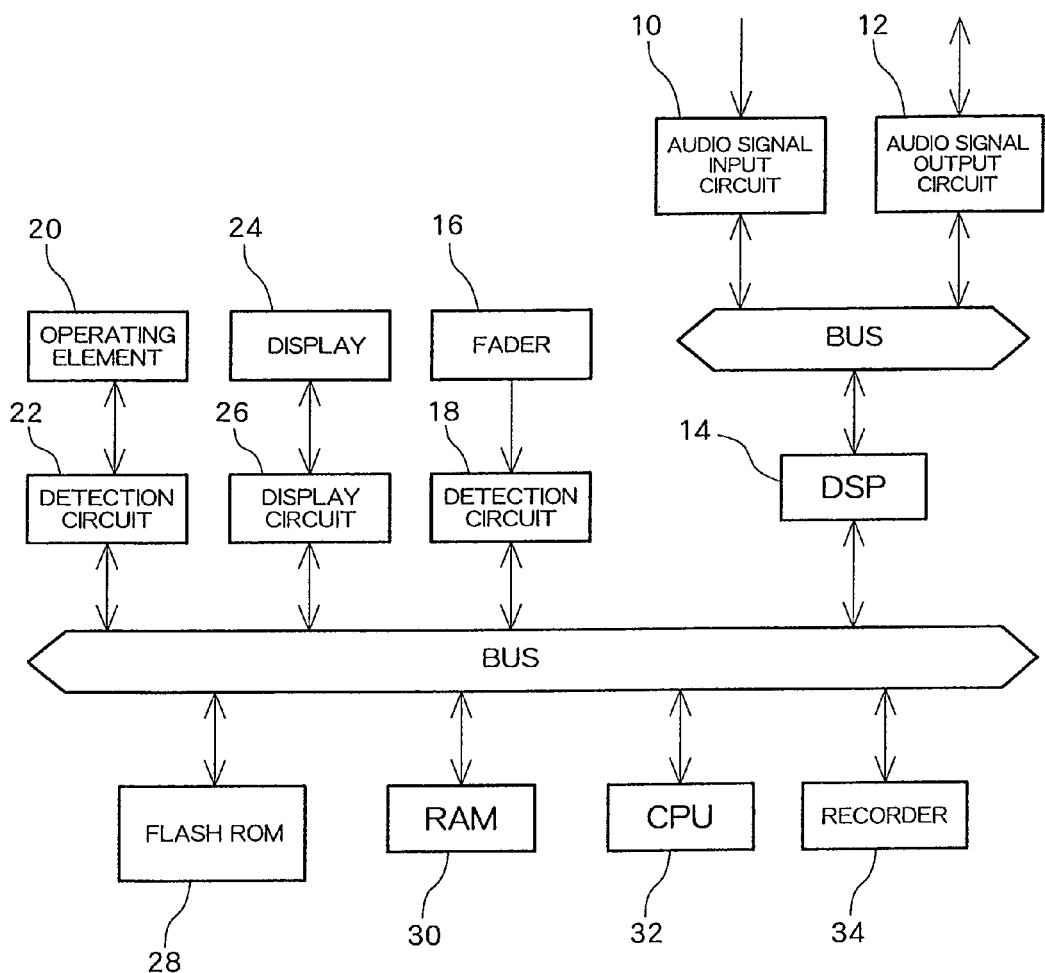
FIG. 1 is a block diagram of a multitrack recorder of the embodiment.

FIG. 1 is a block diagram of a multitrack recorder of the embodiment. An audio signal input circuit 10 has a plurality of input ports and inputs an audio signal from a plurality of sound sources (sources). The plurality of audio signals are exemplified by audio signals of a guitar, vocals, a drum, and so on. In the embodiment, the audio signal input circuit 10 has eight input ports A to H and inputs audio signals by way of the respective input ports. The input ports A to H are hereinbelow referred to as channels A to H. The audio signals input from the audio signal input circuit 10 are fed to a DSP (Digital Signal Processor) 14 by way of a bus.

Under control of a CPU 32, the DSP 14 subjects the audio signals of the plurality of channels fed from the audio signal input circuit 10 to various types of digital processing; for instance, effect processing, equalizing, and mixing, and records processing results in a recorder 34 by way of the bus. A recording medium of the recorder 34 is an optical disk, such as a CD-R/RW disk and a DVD-R/RW disk, a hard disk drive, a flash memory medium, and the like. Processing performed by the DSP 14 includes processing for controlling sound levels of the respective audio signals according to operation positions of faders to be described later.

The faders 16 are disposed on an operating panel of the multitrack recorder in correspondence with a plurality of tracks, respectively. The faders are provided in a one-to-one correspondence with the plurality of tracks, respectively. However, they can also be provided for a plurality of tracks; namely, two tracks or more, in a many-to-one correspondence. A detecting circuit 18 detects operation positions of the respective faders 16. The detecting circuit 18 supplies the CPU 32 with operation position detection signals pertaining to the faders 16, by way of the bus.

Operating elements 20 are disposed on the operating panel of the multitrack recorder. The operating elements 20 are comprised of various key switches, selection buttons, menu buttons, decision buttons, and the like. The user assigns each of the audio signals of the plurality of channels to at least one of the plurality of tracks by operating any of the operating elements 20. A detection circuit 22 detects operation statuses of the respective operating elements 20. The detection circuit 22 supplies the CPU 32 with an operation status detection signal pertaining to the operating elements 20 by way of the bus.

The CPU 32 integrally controls the entirety of the multitrack recorder. In accordance with programs stored in flash ROM 28, the CPU 32 executes various types of processing operations by use of RAM 30 serving as working memory. Specifically, according to the operation status detection signal from the detection circuit 22, the CPU 32 assigns each of audio signals of a plurality of channels to at least any of a plurality of tracks. For instance, when there are tracks 1 through 24, channel A is assigned to the track 1; channel B is assigned to the track 2; and channel C is assigned to the track 10. In the embodiment, correspondence between each channel and each track, which is determined as a result of assignment of the channel to the track, is referred to as "assignment information." The CPU 32 supplies a display circuit 26 with various types of information. The display circuit 26 displays the information on a display 24. According to a fader operation position detection signal from the detection circuit 18, the CPU 32 commands the display circuit 26 to display levels of the channels assigned to the respective tracks in a rod graph format (a level meter). The display circuit 26 displays a level meter image on the display 24 according to the information from the CPU 32. The CPU 32 commands the display circuit 26 to display assignment information on the display 24 while the information is superposed on the level meter images displayed on the display 24. In response to user's operation, the CPU 32 also sets some of the plurality of faders as belonging to the same group and stores grouping information about the group into the RAM 30. Of the plurality of thus-grouped faders, a fader situated at a predetermined position is automatically set as a master fader, and the other faders in the same group are also automatically set as slave faders. Additional explanations about the master fader and the slave faders will be provided later. The CPU 32 changes a display status of an indicator provided for each of the faders according to which one of the grouped faders is operated. Information about which one is master fader and which one is a slave fader is also stored in the RAM 30. Moreover, the CPU 32 reads audio signals recorded in the recorder 34 according to the operation status detection signal from the detection circuit 22 and supplies the thus-read audio signals to the DSP 14. The DSP 14 outputs the audio signals to the outside by way of the bus and an audio signal output circuit 12. The audio signal output circuit 12 has various output ports, such as an analogue output port and a digital output port.

Figure 2:
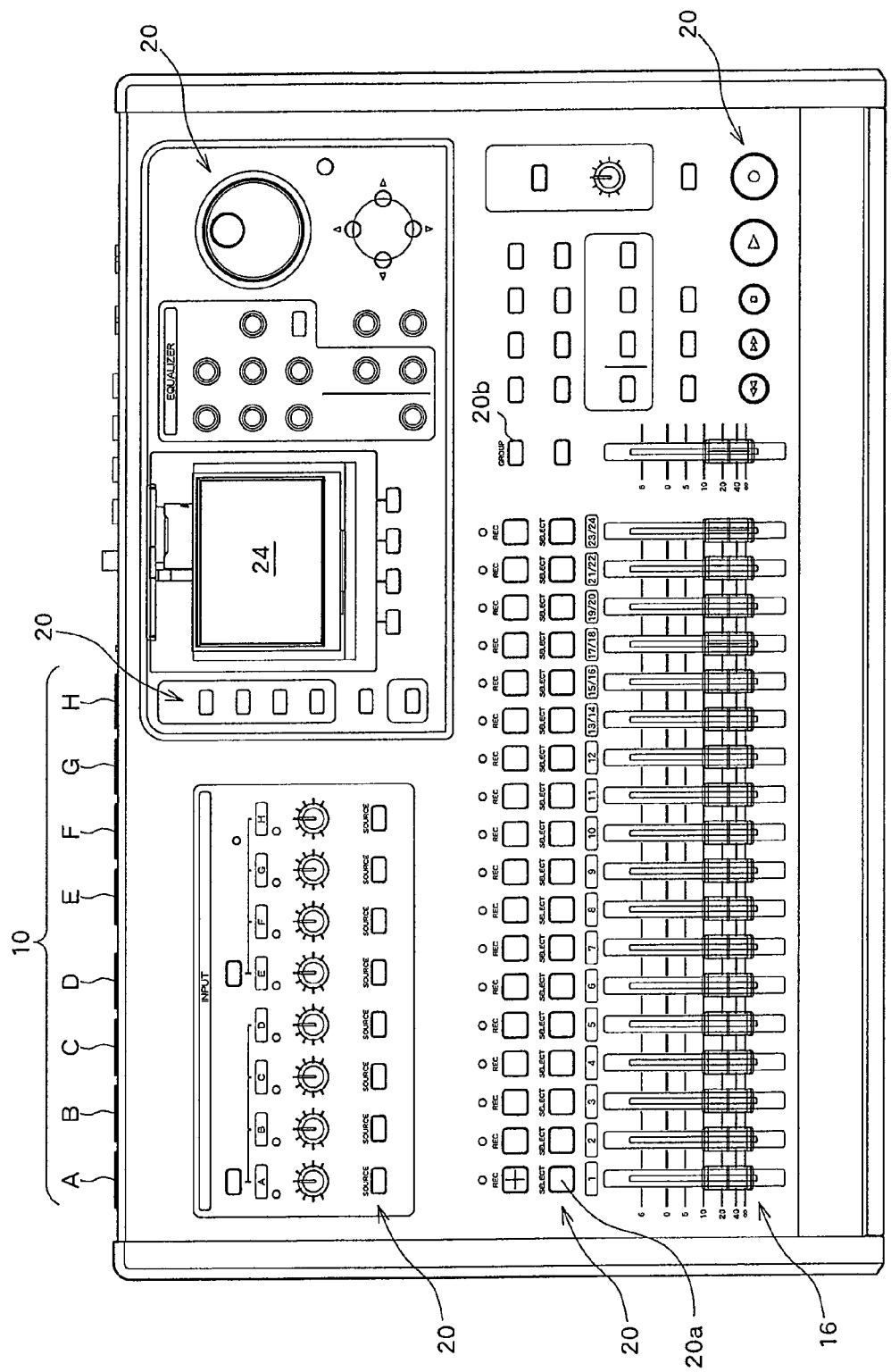
FIG. 2 is a plan view of the multitrack recorder.
Figure 3:
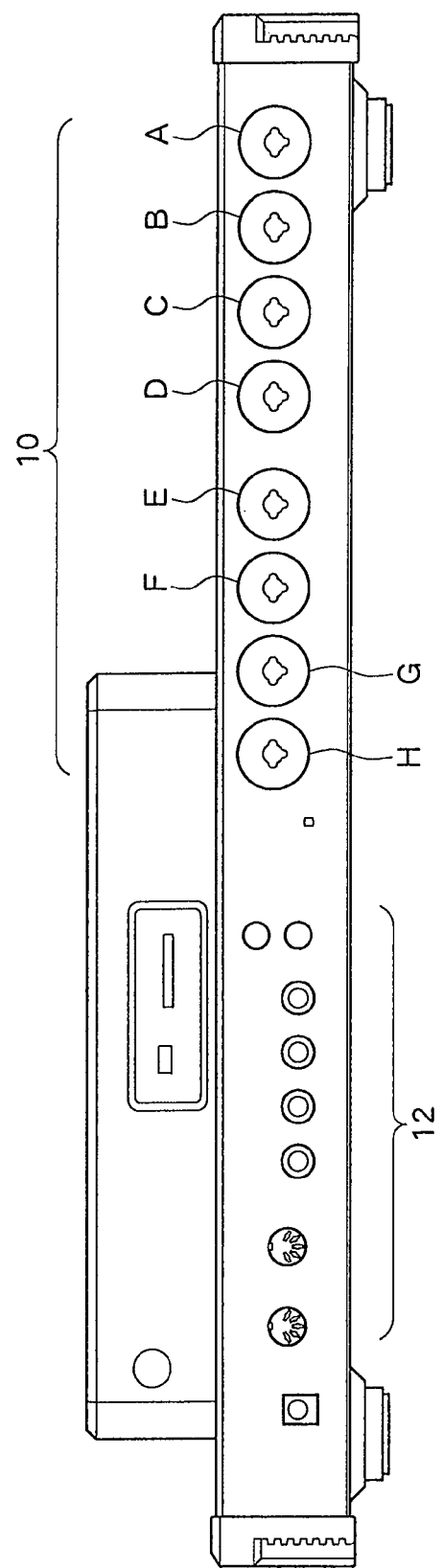
FIG. 3 is a rear view of the multitrack recorder.

FIG. 2 shows a plan view of the multitrack recorder of the embodiment. FIG. 3 shows a rear view of the multitrack recorder.

The various types of operating elements 20, the faders 16, and the display 24 are provided on the operating panel of the multitrack recorder. The input ports 10A to 10H and the output ports 12 are provided on a rear surface of the multitrack recorder. In addition to including selection switches and a jog dial for assigning the audio signals of the channels A to H to any of the tracks 1 through 24, and arrow keys, the operating elements 20 include operating switches, or the like, for commanding recording, playback, stopping, fast-forwarding, and rewinding of audio signals recoded in the recorder 34. When assigning the audio signal of each of the channels A to H to any of the tracks 1 through 24, the user first selects desired tracks to be assigned by operating the selection buttons provided for the faders 16 of the respective tracks and operates a desired one of the selection buttons provided for the respective channels A to H, thereby selecting a channel to be assigned to the track. Alternatively, the user can also select and assign a channel and a track by operating the jog dial and the arrow keys. As a matter of course, the method for assigning the channels to the respective tracks is not limited to that mentioned above, and an arbitrary means can be used. Arbitrary means can be adopted instead, so long as they have a function of selecting a desired channel from a plurality of channels, another function of selecting a desired track from a plurality of tracks, and yet another function of correlating the thus-selected channel and the thus-selected track with each other. Assignment information; for instance, Channel A (guitar audio signal)—Track 1
Channel B (drum)—Track 2
Channel C (soprano vocal)—Track 3
Channel D (tenor vocal)—Track 4,
is generated and stored in the RAM 30.

The fader 16 is provided for each of the tracks. In the embodiment, in consideration of miniaturization of the multitrack recorder, the fader 16 is provided for each of the tracks 1 through 12. However, one fader 16 is provided commonly for two tracks from tracks 13 to 24. Namely, one fader 16 is provided for the tracks 13 and 14; another one fader 16 is provided for the tracks 15 and 16; and so on. When the user has operated the fader 16 for the track 1, the detection circuit 18 detects an operation position of the fader 16 and feeds the thus-detected position to the CPU 32. The CPU 32 commands the DSP 14 to control, increasingly or decreasingly, a level of an audio signal of the channel assigned to the track 1 (i.e., the channel A in the above case) on the basis of the operation position detection signal and the assignment information stored in the RAM 30 and in accordance with an operation position of the fader 16. Pursuant to the command from the CPU 32, the DSP 14 controls, increasingly or decreasingly, the level of the audio signal of the corresponding channel.

The plurality of faders 16 are appropriately grouped as necessary in response to user's operation. During grouping operation, there are used selection-switch-indicators 20a provided respectively for the plurality of faders 16 and a grouping ON/OFF switch 20b. When grouping some of the plurality of faders 16, the user first operates the grouping ON/OFF switch 20b, to thus activate the grouping function. Next, the user presses the selection-switch-indicators 20a provided above the faders 16 desired to be grouped, thereby selecting the faders 16 to be grouped. For instance, channels are assumed to be assigned as follows:

Channel A—Track 7
Channel B—Track 8
Channel C—Track 9
Channel D—Track 10.

Further, when the four faders 16 assigned to the tracks 7 to 10 are grouped, the user sequentially presses the selection-switch-indicator 20a corresponding to the fader 16 of the track 7, the selection-switch-indicator 20a corresponding to the fader 16 of the track 8, the selection-switch-indicator 20a corresponding to the fader 16 of the track 9, and the selection-switch-indictor 20a corresponding to the fader 16 of the track 10. The detection circuit 22 detects an operation status of the grouping ON/OFF switch 20b and operation statuses of the selection-switch-indicators 20a corresponding to the respective faders 16 and feeds the thus-detected statuses to the CPU 32. The CPU 32 groups the four faders 16 of the tracks 7 to 10 by use of the detection signal from the detection circuit 22 and stores grouping information in the RAM 30. Further, the CPU 32 sets to a master fader the fader 16 corresponding to the leftmost track in a single group; i.e., the fader 16 corresponding to the track having the smallest number, while grouping the faders and also sets the other faders in the same group to slave faders. The grouping information also includes information used for identifying which fader is a master and which faders are slaves. In the above, the leftmost fader 16 among the four faders 16 of the grouped tracks 7 to 10; namely, the fader 16 corresponding to the track 7 having the smallest number, is set as a master fader. The three faders 16 corresponding to the remaining tracks 8 to 10 are set to slave faders.

When the user has operated the master fader of the faders corresponding to the grouped tracks 7 to 10, the CPU 32 commands the DSP 14 to increase or decrease the sound volume level of the audio signals of the respective tracks while maintaining a ratio of levels of all faders 16 belonging to the same group. Further, when the master fader is operated, the CPU 32 turns on the selection-switch-indicators 20a for all of the faders belonging to the same group. In the above, when the user operates the fader 16 corresponding to the track 7, the sound volume levels of the audio signals of the tracks 8 to 10 belonging to the same group are also increased or decreased so as to maintain a ratio of the levels of the faders of the tracks 8 to 10 to the level of the fader 16 of the track 7. Incidentally, the faders 16 of the tracks 8 to 10 do not always need to undergo physical movement. Concurrently, all of the selection-switch-indictors 20a corresponding to the faders 16 of the tracks 7 to 10 are lighted. In the meantime, when the user operates any of the slave faders of the grouped tracks 7 to 10, the CPU 32 revokes the operation. Specifically, although the tracks are grouped, the sound volume level of all of the tracks in the group is maintained without change. On this occasion, the CPU 32 lights up or blinks the selection-switch-indicator 20a corresponding to the master fader in the same group. Even when the user operates the fader 16 corresponding to the track 10, the sound volume level of all of the tracks 7 to 10, including the track 10 of the operated fader 16, is maintained without change; in other words, operation of the fader 16 of the track 10 is revoked. Alternatively, only the selection-switch-indicator 20a for the fader 16 corresponding to the track 7 is lighted or blinked, and the selection-switch-indicators 20a corresponding to the faders 16 of the tracks 8 to 10 remain extinguished.

The display 24 is disposed at a substantially upper center area of the operating panel of the multitrack recorder. The display 24 is constituted of a liquid crystal display, an organic EL display, or the like. A level of an audio signal assigned to a track (i.e., a level commensurate with the operation position of the fader 16) is displayed as a level meter image for each of the tracks on the display 24. Moreover, assignment information is displayed in a superposed manner at predetermined positions of each of the level meter images. Information about grouped tracks may also be displayed on the display 24.

Figure 4:
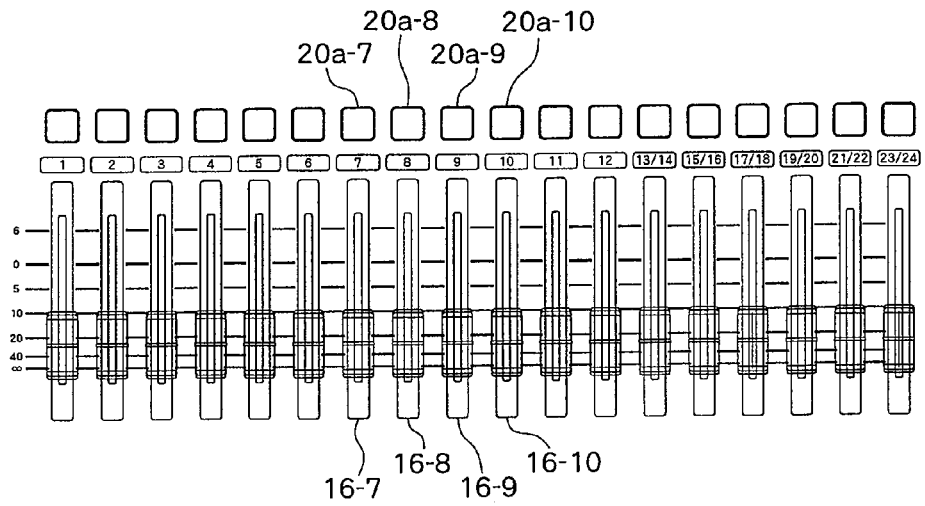
FIG. 4 is an explanatory view for grouping faders of the multitrack recorder.
Figure 5:
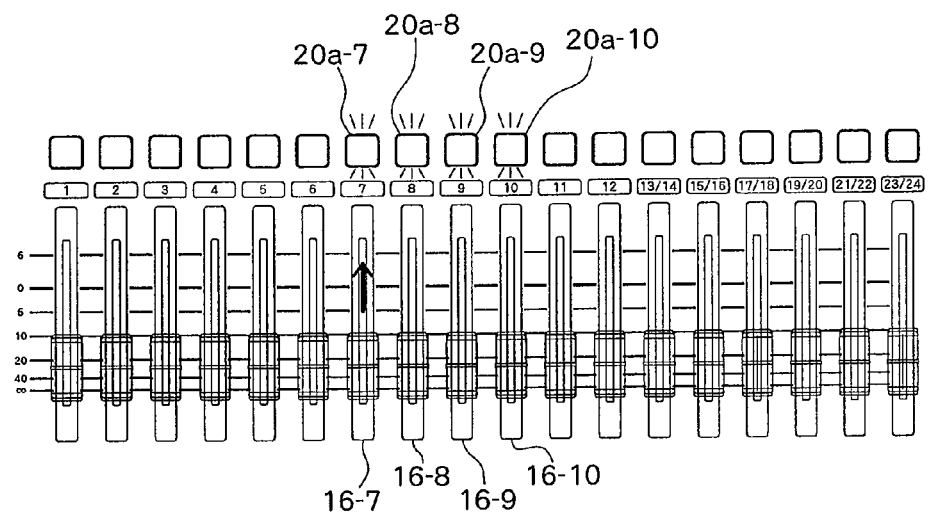
FIG. 5 is an explanatory view achieved when a master fader is operated.
Figure 6:
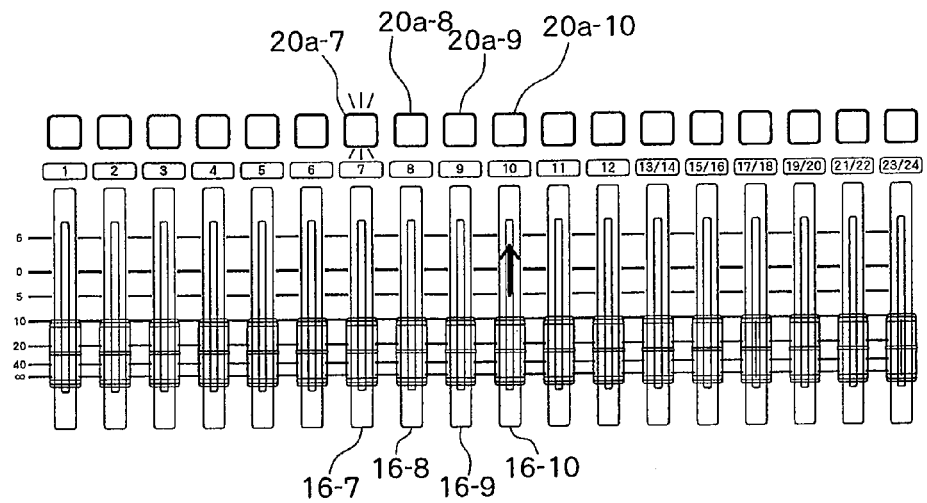
FIG. 6 is an explanatory view achieved when a slave fader is operated.

FIGS. 4 through 6 show an indication status of the selection-switch-indicator 20a corresponding to the operation status of the fader 16.

FIG. 4 shows a status achieved during grouping operation. The faders 16 corresponding to the tracks 7 to 10 are taken as a fader 16-7, a fader 16-8, a fader 16-9, and a fader 16-10. Further, the selection-switch-indicators 20a corresponding to the faders 16-7 to 16-10 are also taken as a selection-switch-indicator 20a-7, a selection-switch-indicator 20a-8, a selection-switch-indicator 20a-9, and a selection-switch-indicator 20a-10. When grouping the faders 16-7 to 16-10, the user first respectively operates the faders 16-7 to 16-10, thereby controlling sound volume levels of audio signals of the channels of the respective tracks 7 to 10 to a desired level. After the sound volume levels have been balanced, the grouping ON/OFF switch 20b is pressed, to thus activate the grouping function. Following this, the selection-switch-indictors 20a-7 to 20a-10 corresponding to the faders 16-7 to 16-10 are sequentially pressed and selected. Through the operation, the faders 16-7 to 16-10 are grouped, and a grouping result is stored as grouping information in the RAM 30. When any of the faders 16 is released from the group after the faders 16-7 to 16-10 have been grouped, the user again presses the selection-switch-indicator 20a corresponding to the fader 16 to be released from the group. For instance, when the fader 16-10 is released from the group, the selection-switch-indicator 20a-10 is pressed again. In accordance with the operating status of the selection-switch-indicator 20a-10, the CPU 32 generates group information about the group from which the fader 16-10 has been released, rewriting the group information in the RAM 30. When the user has released the fader 16-7, which is the master fader, from the group, the CPU 32 automatically sets the leftmost fader among the faders 16-8 to 16-10 still remaining in the same group; namely, the fader 16-8 corresponding to the track having the smallest number, as a new master fader in place of the fader 16-7. In order to cancel grouping of all of the faders 16-7 to 16-10, all of the selection-switch-indicators 20a-7 to 20a-10 are pressed again. Alternatively, the grouping ON/OFF switch 20b may also be pressed to deactivate the grouping function.

FIG. 5 shows a state achieved when the user has operated the fader 16-7, which is automatically set to the master fader, among the grouped faders 16-7 to 16-10. As indicated by an arrow in the drawing, when the user operates the fader 16-7 to thereby increase or decrease its sound volume level, all of the faders 16-8 to 16-10 that are all slave faders in the same group are increased or decreased synchronously so as to maintain a relative ratio of the level of the fader 16-7 that is the master fader to the levels of the other faders. Moreover, in this case, all of the selection-switch-indicators 20a-7 to 20a-10 corresponding to the faders 16-7 to 16-10 are lighted. Thereby, the user can readily ascertain that the faders 16-7 to 16-10 are grouped and belong to the same group. When the user stops operating the fader 16-7 that is the master fader, the selection-switch-indictors 20a-7 to 20a-10 are also extinguished correspondingly. The selection-switch-indicators 20a-7 to 20a-10 corresponding to all of the faders in the same group are lighted only when the master fader is operated, whereby the user can realize that a balance of the levels of all of the grouped faders is synchronously maintained and controlled without fail. In the case of manual faders, the slave fader 16-8 to the slave fader 16-10 do not physically move in a synchronous manner. However, in the case of so-called moving faders, the faders can also physically move in a synchronous manner.

FIG. 6 shows a status achieved when the user has operated any one of the faders 16-8 to 16-10 automatically set to the slave faders among the grouped faders 16-7 to 16-10; for instance, the fader 16-10. As indicated by an arrow in the drawing, even when the user has operated the fader 16-10, a level of an audio signal of the channel assigned to the track 10 of the fader 16-10 remains unchanged. Further, the other faders 16-7 to 16-9 belonging to the same group also do not operate in synchronization with operation of the fader 16-10. Thus, levels of the audio signals of the channels assigned to the respective faders remain unchanged. Specifically, operation of the fader 16-10 is revoked. Further, in this case, only the selection-switch-indicator 20a-7 corresponding to the fader 16-7 that is the master fader is lighted or blinked. The selection-switch-indictors 20a-8 to 20a-10 remain extinguished. The same also applies to the case where the fader 16-8 or the fader 16-9 is operated, and the operation is revoked. Further, only the selection-switch-indicator 20a-7 is lighted or blinked, whilst the selection-switch-indicators 20a-8 to 20a-10 remain extinguished. From the fact that only the selection-switch-indicator 20a-7 is lighted or blinked and that the selection-switch-indictors 20a-8 to 20a-10 remain extinguished, the user can ascertain that operation of the fader 20a-10 is revoked and that the other faders do not operate synchronously. Moreover, the user can readily ascertain which fader is set to the master fader and which fader should be operated.

Figure 7:
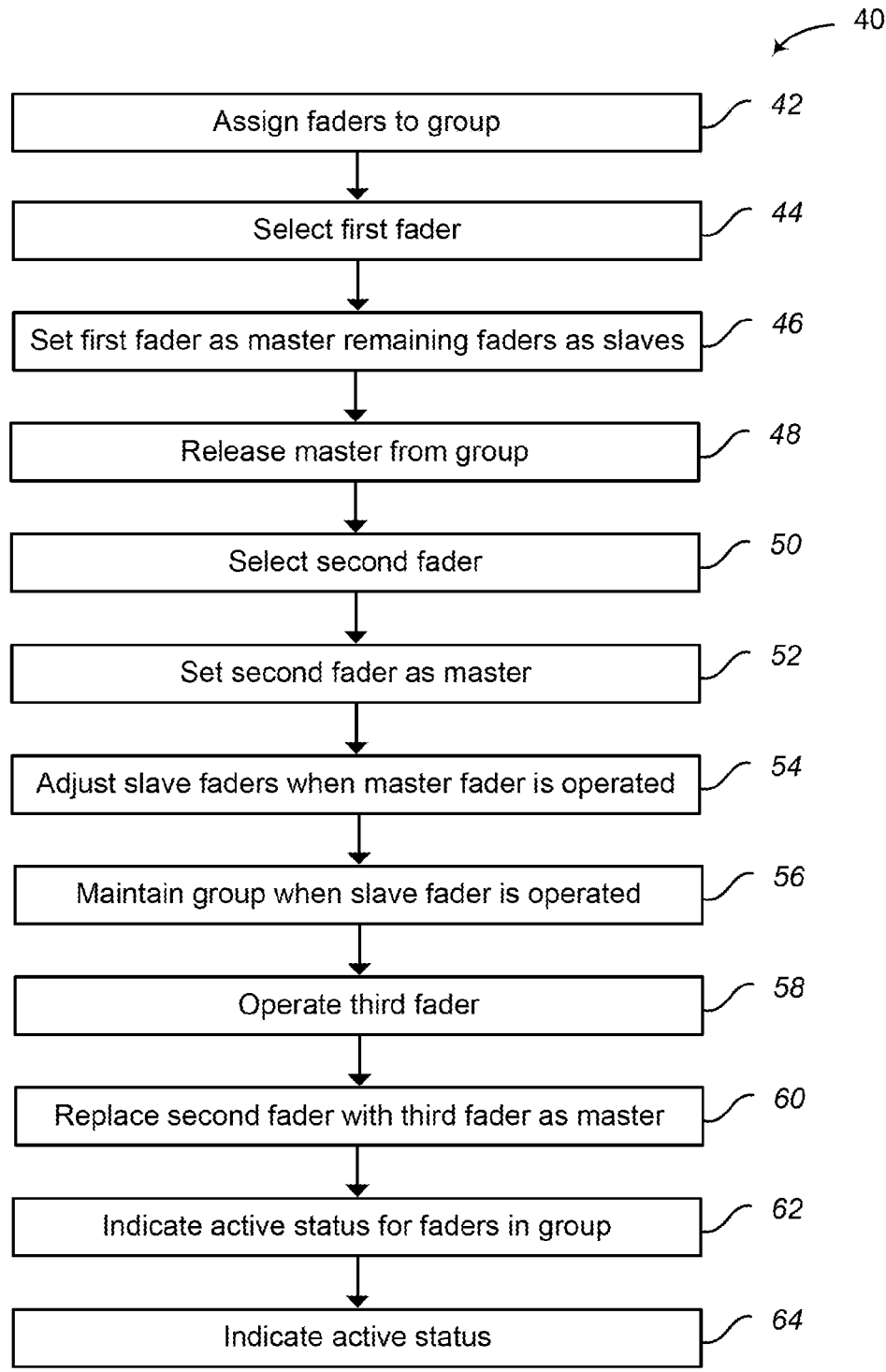
FIG. 7 is a flowchart of a method according to at least one embodiment of the present disclosure.

FIG. 7 is a flowchart of a method 40 according to at least one embodiment of the present disclosure. The method 40 is performed using the multitrack recorder shown in FIG. 1. At 42, the CPU 32 assigns a plurality of faders to a group of faders by generating grouping information for the group and storing it in the RAM 30. At 44, the CPU 32 selects a first fader in the group of faders based on the first fader's physical position on an operating panel. For example, the CPU 32 selects the leftmost fader in the group as the master fader. At 46, the CPU 32 sets the first fader as a master fader and remaining faders in the group of faders as slave faders. For example, the CPU 32 generates grouping information indicating that the first fader is the master fader and the remaining faders in the group are slave faders, and causes the grouping information to be stored in the RAM 30. At 48, the CPU 32 releases the master fader from the group of faders. For example, the CPU 32 generates grouping information indicating that the first fader is no longer part of the group, and causes the grouping information to be stored in the RAM 30. At 50, the CPU 32 selects a second fader in the group of faders based on the second fader's physical position on an operating panel, in response to the CPU 32 releasing the master fader from the group of faders at 48. For example, the CPU 32 selects the leftmost fader in the group. At 52, the CPU 32 sets the second fader as a new master fader. For example, the CPU 32 generates grouping information indicating the second fader is the master fader, and causes the grouping information to be stored in the RAM 30. At 54, the CPU 32 causes the slave faders to be adjusted synchronously with the master fader, when the master fader is operated. At 56, the CPU 32 controls the group of faders to be maintained at their previous positions, when any of the slave faders are operated. At 58, a third fader in the group of faders is operated a plurality of times. At 60, the CPU 32 replaces the second fader with the third fader as the new master fader. For example, the CPU 32 generates grouping information indicating that the third fader is the master fader and the second fader is a slave fader, and causes the grouping information to be stored in the RAM 30. At 62, the CPU 32 causes an active status for all faders in the group of faders to be indicated when the master fader is operated. For example, the CPU 32 causes the selection-switch-indicators 20a for all faders in the group of faders to blink when the master fader is operated. At 64, the CPU 32 causes an active status to be indicated for the master fader and inactive statuses to be indicated for the slave faders when any of the slave faders are operated. For example, the CPU 32 causes the selection-switch-indicator 20a for the master fader to blink and causes the selection-switch-indicators 20a for the slave faders to remain extinguished when any of the slave faders are operated.

Figure 8:
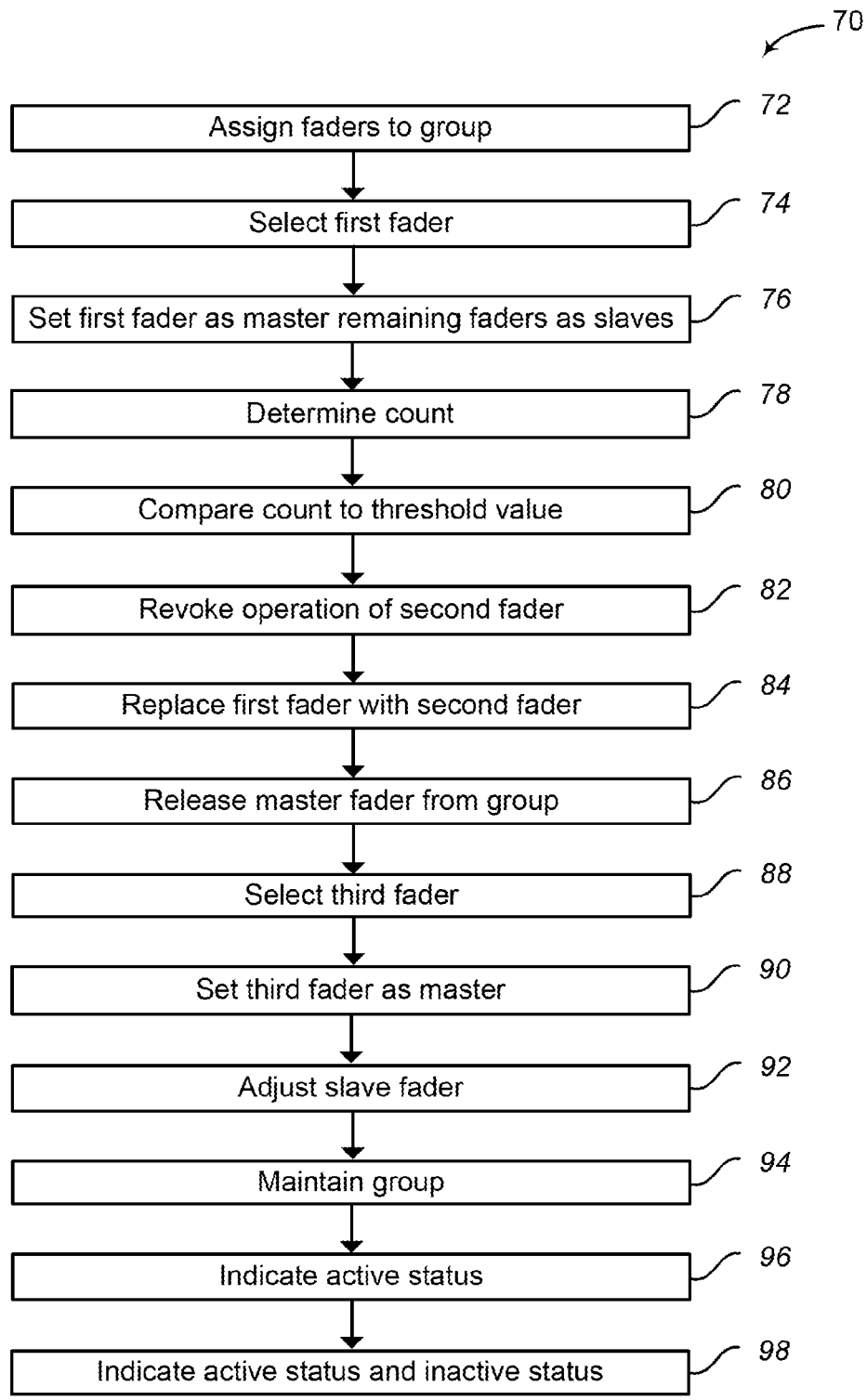
FIG. 8 is a flowchart of a method according to at least one embodiment of the present disclosure.

FIG. 8 is a flowchart of a method 70 according to at least one embodiment of the present disclosure. The method 70 is performed using the multitrack recorder shown in FIG. 1. At 72, the CPU 32 assigns a plurality of faders to a group of faders by generating grouping information for the group and storing it in the RAM 30. At 74, the CPU 32 selects a first fader in the group of faders based on the first fader's physical position on an operating panel. For example, the CPU 32 selects the leftmost fader in the group as the master fader. At 76, the CPU 32 sets the first fader as a master fader and remaining faders in the group of faders as slave faders. For example, the CPU 32 generates grouping information indicating that the first fader is the master fader and the remaining faders in the group are slave faders, and causes the grouping information to be stored in the RAM 30. At 78, the CPU 32 determines a count of a number of times a second fader has been operated, wherein the second fader is one of the slave faders. At 80, the CPU 32 compares the count to a threshold value. At 82, the CPU 32 revokes an operation of the second fader when the count is below the threshold value. For example, the CPU 32 does not adjust an audio level of a track corresponding to the second fader when the second fader is operated and the count is below the threshold value. At 84, the CPU 32 replaces the first fader with the second fader as the master fader when the count is above or equal to the threshold. For example, the CPU 32 generates grouping information indicating that the first fader is a slave fader and the second fader is the master fader, and causes the grouping information to be stored in the RAM 30. At 86, the CPU 32 releases the master fader from the group of faders. For example, the CPU 32 generates grouping information indicating that the previous master fader is a slave fader, and causes the grouping information to be stored in the RAM 30. At 88, the CPU 32 selects a third fader in the group of faders based on the third fader's physical position on an operating panel, in response to the CPU 32 releasing the master fader from the group of faders at 86. For example, the CPU 32 selects the leftmost fader in the group. At 90, the CPU 32 sets the third fader as a new master fader. For example, the CPU 32 generates grouping information indicating that the third fader is the master fader, and causes the grouping information to be stored in the RAM 30. At 92, the CPU 32 causes the slave faders to be adjusted synchronously with the master fader, when the master fader is operated. At 94, the CPU 32 controls the group of faders such that they are maintained at their previous positions, when any of the slave faders are operated. At 96, the CPU 32 causes an active status for all faders in the group of faders to be indicated when the master fader is operated. For example, the CPU 32 causes the selection-switch-indicators 20*a* for all faders in the group of faders to blink when the master fader is operated. At 98, the CPU 32 causes an active status to be indicated for the master fader and inactive statuses to be indicated for the slave faders when any of the slave faders are operated. For example, the CPU 32 causes the selection-switch-indicator 20*a* for the master fader to blink and causes the selection-switch-indicators 20*a* for the slave faders to remain extinguished when any of the slave faders are operated.

Although the embodiments of the invention have been described above, the invention is not limited to that and susceptible to various modifications.

For instance, the selection-switch-indicators 20*a* are provided for the respective faders 16 in the embodiment. However, selection switches and indicators may also be disposed separately from each other. The indicators can be made up of an LED.

Furthermore, the selection-switch-indicators 20*a* and the grouping ON/OFF switch 20*b* are used for grouping a plurality of faders in the embodiment. They build up group setting means along with the CPU 32. However, means for setting a group is arbitrary, and the essential requirement for the means is to have a function of selecting an arbitrary fader from a plurality of faders and another function of determining grouping of the plurality of faders.

In the embodiment, the fader 16 corresponding to the leftmost track; namely, the track having the smallest number, among the plurality of grouped faders 16 is automatically set to the master fader. The other faders 16 in the same group are automatically set to the slave faders. However, the fader 16 corresponding to the rightmost track; namely, the track having the largest number, may also be automatically set to the master fader. Further, the fader 16 first selected at the time of grouping operation may also be automatically set as a master fader. Another configuration in which the user arbitrarily, manually sets the master fader can also be adopted instead of automatic setting of the master fader and the slave faders. However, manual setting of the master fader is troublesome for the user, which may deteriorate ease of operation; hence, automatic setting of the master fader carried out in the multitrack recorder is desirable. It is also possible for the user to previously determine and register a rule for automatically setting which one of faders in the group to a master fader. For instance, the user operates any of the operating elements 20, such as a jog dial and an arrow key, to thus select and determine, in advance, a rule for automatically setting a fader to a master fader from among a plurality of rules. According to the rule selected by the user, the CPU 32 automatically sets one fader among faders in a group as a master fader and stores the thus-set fader in the RAM 30.

In the embodiment, when any of the slave faders is operated, only the indictor corresponding to the master fader is lighted or blinked. However, in contradistinction with the fact that the indicators of all of the faders in the same group are lighted when the master fader is operated, it can be said to be desirable to blink the indicator corresponding to the master fader for a predetermined duration when any of the slave faders is operated. The reason for this is that the user is prevented from falsely recognizing lighting of the indicator corresponding to the master fader that the master fader is operated synchronously. As a matter of course, when any of the slave faders is operated, the indicator corresponding to the master fader can be lighted in different color.

Moreover, when the user continuously operates the slave faders a number of times, the CPU 32 can regard that the user tends to operate a specific fader in the group and can automatically set the slave fader continuously operated the number of times by the user as a new master fader. In the case of for instance, FIG. 6, when the user has continuously operated the fader 16-10 twice, the master fader is changed from the fader 16-7 to the fader 16-10, and the like. User's operability is thereby enhanced to a much greater extent.

Although the explanations have been given by means of taking the multitrack recorder by way of example in the embodiment, the present invention can also be applied to an electronic device with faders; for instance, a mixer.

What is claimed is:

1. An electronic device, comprising:
    a plurality of faders that are configured to control audio signal levels of a plurality of channels;
    a processor coupled to the plurality of faders;
    at least one memory coupled to the processor, the at least one memory storing at least one program that, when executed by the processor, causes the electronic device to:
        assign a plurality of faders to a group of faders by storing in the at least one memory grouping information identifying each of the plurality of faders in the group of faders;
        select a first fader in the group of faders based on the first fader's physical position on an operating panel by selecting one of the plurality of faders in the group of faders based on a rule which is determined in advance;
        set the first fader as a master fader and remaining faders in the group of faders as slave faders by storing in the at least one memory information identifying the first fader as the master fader and the remaining faders in the group of faders as the slave faders;

release the master fader from the group of faders by rewriting the grouping information;

select a second fader in the group of faders by selecting one of the remaining faders in the group based on the rule which is determined in advance in response to the master fader being released, the second fader being one of the slave faders, the selecting of the second fader being based on the second fader's physical position on the operating panel; and set the second fader as a new master fader by storing in the at least one memory information identifying the second fader as the master fader in the group of faders.

2. The electronic device according to claim 1, wherein the at least one program, when executed by the processor, causes the electronic device to:

adjust the slave faders synchronously with the master fader when the master fader is operated; and maintain the group of faders when any of the slave faders are operated.

3. The electronic device according to claim 1, wherein the at least one program, when executed by the processor, causes the electronic device to:

replace the second fader with a third fader as the new master fader in response to the third fader being operated a plurality of times.

4. The electronic device according to claim 1, wherein the at least one program, when executed by the processor, causes the electronic device to:

indicate an active status for all faders in the group of faders when the master fader is operated; and indicate an active status for the master fader and inactive statuses for the slave faders when any of the slave faders are operated.

5. The electronic device according to claim 1, wherein the at least one program, when executed by the processor, causes the electronic device to automatically select the first and second fader.

6. An electronic device, comprising:

a plurality of faders that are configured to control audio signal levels of a plurality of channels;

a processor coupled to the plurality of faders;

at least one memory coupled to the processor, the at least one memory storing at least one program that, when executed by the processor, causes the processor to:

assign a plurality of faders to a group of faders by storing in the at least one memory grouping information identifying each of the plurality of faders in the group of faders;

select a first fader in the group of faders based on the first fader's physical position on an operating panel by selecting one of the plurality of faders in the group of faders based on a rule which is determined in advance;

set the first fader as a master fader and remaining faders in the group of faders as slave faders by storing in the at least one memory information identifying the first fader as the master fader and the remaining faders in the group of faders as the slave faders;

determine a count of a number of times a second fader has been operated by storing in the at least one memory a value indicating a number of times the second fader has been continuously operated, the second fader being one of the slave faders;

compare the count to a threshold value;

revoke operation of the second fader by maintaining a sound level of each of a plurality of tracks that are respectively assigned to the plurality of faders without change when the count is below the threshold value; and replace the first fader with the second fader as the master fader by storing in the at least one memory information identifying the second fader as the master fader in the group of faders when the count is above or equal to the threshold value.

7. The electronic device according to claim 6, wherein the at least one program, when executed by the processor, causes the electronic device to:

release the master fader from the group of faders;

select a third fader in the group of faders in response to the master fader being released, the third fader being one of the slave faders, the third fader being selected based on the third fader's physical position on the operating panel; and set the third fader as a new master fader.

8. The electronic device according to claim 6, wherein the at least one program, when executed by the processor, causes the electronic device to:

adjust the slave faders synchronously with the master fader when the master fader is operated; and maintain the group of faders when any of the slave faders are operated.

9. The electronic device according to claim 6, wherein the at least one program, when executed by the processor, causes the electronic device to:

indicate an active status for all faders in the group of faders when the master fader is operated; and indicate an active status for the master fader and inactive statuses for the slave faders when any of the slave faders are operated.

* * * * *